(12) United States Patent
Ko et al.

(10) Patent No.: US 9,390,982 B2
(45) Date of Patent: Jul. 12, 2016

(54) CMOS DEVICES WITH REDUCED LEAKAGE AND METHODS OF FORMING THE SAME

(71) Applicant: Taiwan Semiconductor Manufacturing Company, Ltd., Hsin-Chu (TW)

(72) Inventors: Chih-Hsin Ko, Hsin-Chu (TW); Cheng-Hsien Wu, Hsin-Chu (TW); Clement Hsingjen Wann, Hsin-Chu (TW); Yi-Jing Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/959,355

(22) Filed: Dec. 4, 2015

(65) Prior Publication Data
US 2016/0086862 A1    Mar. 24, 2016

Related U.S. Application Data

(62) Division of application No. 14/087,425, filed on Nov. 22, 2013, now Pat. No. 9,224,734.

(51) Int. Cl.
*H01L 21/8238* (2006.01)
*H01L 21/306* (2006.01)
(Continued)

(52) U.S. Cl.
CPC .... *H01L 21/823878* (2013.01); *H01L 21/3085* (2013.01); *H01L 21/30604* (2013.01); *H01L 21/31* (2013.01)

(58) Field of Classification Search
CPC ............ H01L 21/823878; H01L 2/306; H01L 21/3085; H01L 21/31; H01L 21/31144; H01L 21/76232

USPC .................................................... 438/283, 752
See application file for complete search history.

(56) References Cited

U.S. PATENT DOCUMENTS 7,700,452 B2* 4/2010 Yu .................. H01L 21/823807
                                                            257/E29.266
8,853,746 B2* 10/2014 Chen .................... H01L 29/161
                                                                  257/19

(Continued)

FOREIGN PATENT DOCUMENTS

KR       20040014716         2/2004
KR       20090023615         3/2009

(Continued)

OTHER PUBLICATIONS

Takagi, Shin-ichi et al., "Fabrication and Device Characteristics of Strained-Si-on-Insulator (Strained-SOI) CMOS," Applied Surface Science, vol. 224, Issues 1-4, pp. 241-247, Mar. 15, 2004.

*Primary Examiner* — Yosef Gebreyesus
(74) *Attorney, Agent, or Firm* — Slater Matsil, LLP

(57) ABSTRACT

A device includes a first semiconductor layer, and a second semiconductor layer over the first semiconductor layer. The first semiconductor layer and the second semiconductor layer comprise different materials. A semiconductor region is overlying and contacting the second semiconductor layer, wherein a bottom surface of the semiconductor region contacts a first top surface of the second semiconductor layer. The semiconductor region and the second semiconductor layer comprise different material. The bottom surface of the semiconductor region has a slanted portion contacting a (551) surface plane of the second semiconductor layer.

20 Claims, 14 Drawing Sheets

(51) Int. Cl.
*H01L 21/308* (2006.01)
*H01L 21/31* (2006.01)

(56) References Cited

U.S. PATENT DOCUMENTS

| | | | |
|---|---|---|---|
| 9,006,786 B2 | 4/2015 | Ching et al. | |
| 2006/0138398 A1* | 6/2006 | Shimamune | H01L 21/02381 257/19 |
| 2008/0169484 A1* | 7/2008 | Chuang | H01L 29/7843 257/190 |
| 2008/0182371 A1* | 7/2008 | Gehring | H01L 21/823807 438/199 |
| 2009/0023231 A1* | 1/2009 | Ohmi | H01L 21/02074 438/16 |
| 2009/0166739 A1 | 7/2009 | Ohmi et al. | |
| 2010/0044754 A1 | 2/2010 | Boyanov et al. | |
| 2010/0059830 A1 | 3/2010 | Ohmi et al. | |
| 2010/0109044 A1* | 5/2010 | Tekleab | H01L 21/823807 257/190 |
| 2010/0230721 A1 | 9/2010 | Yasutake | |
| 2011/0233747 A1 | 9/2011 | Lee et al. | |
| 2014/0203334 A1 | 7/2014 | Colinge et al. | |
| 2014/0353731 A1 | 12/2014 | Colinge et al. | |
| 2015/0076558 A1 | 3/2015 | Lee et al. | |

FOREIGN PATENT DOCUMENTS

| | | |
|---|---|---|
| KR | 20110107766 | 3/2009 |
| WO | 2008000556 | 1/2008 |

\* cited by examiner

CMOS DEVICES WITH REDUCED LEAKAGE AND METHODS OF FORMING THE SAME

PRIORITY CLAIM AND CROSS-REFERENCE

This application is a divisional of U.S. patent application Ser. No. 14/087,425, entitled "CMOS Devices with Reduced Leakage and Methods of Forming the Same," filed on Nov. 22, 2013, which application is incorporated herein by reference.

This application is related to the following commonly-assigned U.S. patents application: application Ser. No. 14/026,067, filed Sep. 13, 2013, and entitled "Semiconductor Structure and the Manufacturing Method Thereof," which application is hereby incorporated herein by reference.

BACKGROUND

With the size of Complementary Metal-Oxide-Semiconductor (CMOS) device being continuously scaled down, the influences of the short channel effect and the charge carrier mobility deterioration effect in the device are increasingly serious. With respect to the development of the silicon-based CMOS technology, the requirements for the ability of suppressing the short channel effect and the ability of improving the charge carrier mobility in the device become more and more urgent.

When the feature sizes of devices enter into sub-100 nm regime, the short channel effect of the device is deteriorated, so that the method for obtaining better performance by further reducing the size of the devices becomes extremely difficult. In order to relieve the pressure resulted from the reduction of the device size, stress is introduced into a channel by adopting strained-silicon technology so as to improve the charge carrier mobility in the channel and the performance of a transistor device, which has become a method widely adopted and indispensable in the engineering of microelectronic fabrication. With the stress being introduced into a channel region of a transistor by means of the device structure, material, and process design, the lattice structure of crystals is varied, and thus leads to the variation of the carrier mobility. Under appropriate stress, the carrier mobility may be improved. For example, the tensile stress in the channel direction improves the electron mobility, and the compressive stress in the channel direction improves the hole mobility.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 11A are cross-sectional views of intermediate stages in the formation of Complementary Metal-Oxide-Semiconductor (CMOS) device in accordance with various exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Complementary Metal-Oxide-Semiconductor (CMOS) device and the method of forming the same are provided in accordance with various exemplary embodiments. The intermediate stages of forming the CMOS device are illustrated. The variations of the embodiments are discussed. Throughout the various views and illustrative embodiments, like reference numbers are used to designate like elements.

Figure 1:
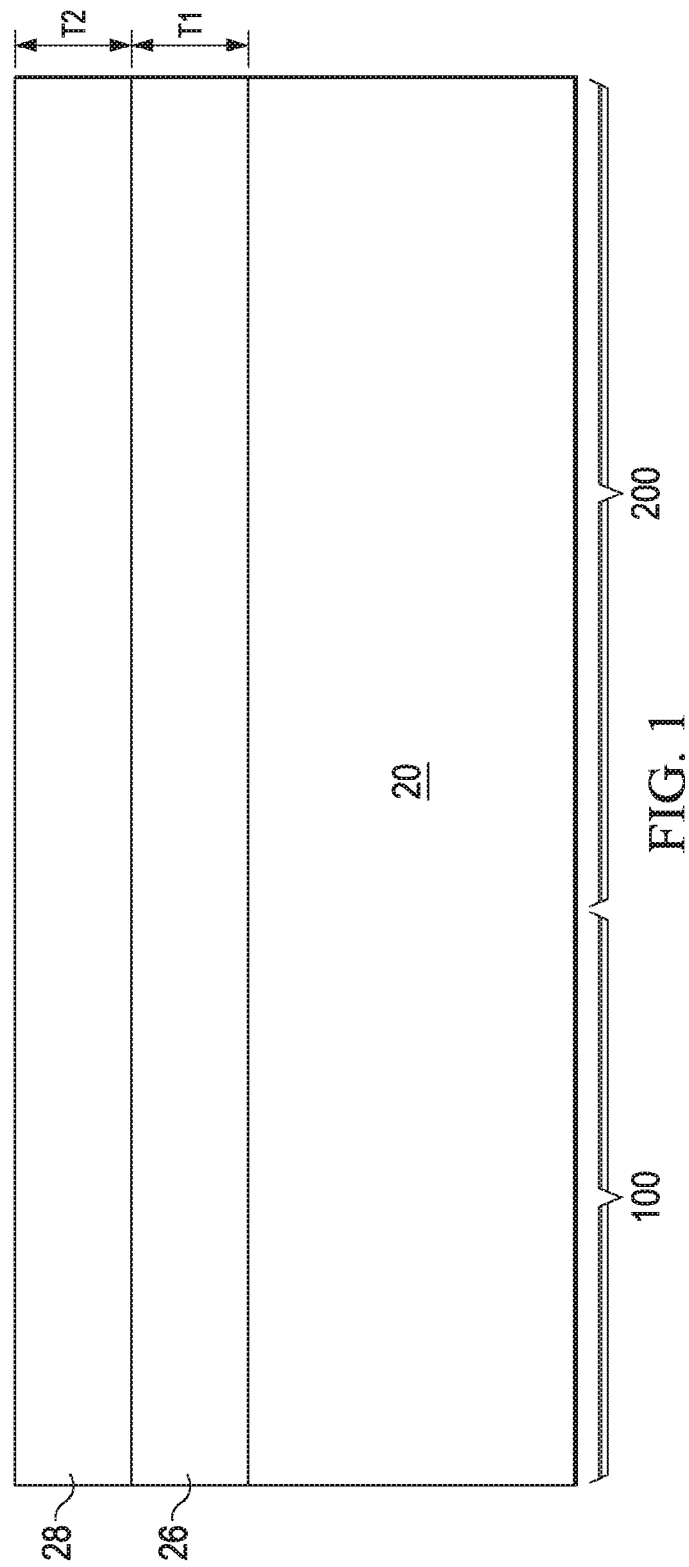

FIGS. 1 through 11A illustrate the cross-sectional views in the formation of Complementary Metal-Oxide-Semiconductor (CMOS) devices in accordance with some embodiments. Referring to FIG. 1, substrate 20 is provided. Substrate 20 may be a semiconductor substrate such as a crystalline silicon substrate. In some exemplary embodiments, substrate 20 is a silicon substrate free from germanium. In other embodiments, substrate 20 includes silicon germanium, silicon carbon, or the like. Substrate 20 includes a portion in P-type Metal-Oxide-Semiconductor (PMOS) device region 100, and a portion in N-type Metal-Oxide-Semiconductor (NMOS) device region 200.

Semiconductor layer 26 is grown on substrate 20 through epitaxy. Semiconductor layer 26 may have a first lattice constant greater than the lattice constant of substrate 20. In some embodiments, semiconductor layer 26 comprises silicon germanium, which is expressed as $Si_{1-X}Ge_X$, wherein value X is the atomic percentage of germanium in semiconductor layer 26, which atomic percentage may be in the range between about 0.2 (20 percent) and about 0.5 (50 percent) in exemplary embodiments. In some embodiments, to form semiconductor layer 26, a silicon-based precursor such as $SiCl_4$ is used in a Chemical Vapor Deposition (CVD) process. In other embodiments, silicon-based precursors including $SiH_4$, $GeH_4$, $SiH_2Cl_2$, and/or $SiHCl_3$ are used to grow the silicon epitaxial layer at an appropriate temperature and growth rate. Semiconductor layer 26 is a strained semiconductor layer, which means that the top portion of semiconductor layer 26 is still strained. This may be achieved by, for example, making thickness T1 of semiconductor layer 26 smaller than the critical thickness, which is the thickness beyond which the overlaying portions of semiconductor layer 26 are relaxed. In some exemplary embodiments, thickness T1 is greater than about 20 nm, and may be in the range between about 20 nm and about 60 nm.

Semiconductor layer 28 is grown on semiconductor layer 26 through epitaxy. Semiconductor layer 28 has a tensile strain. In some embodiments, the tensile strain is generated by making the lattice constant of semiconductor layer 28 smaller than the lattice constant of semiconductor layer 26. In some embodiments, semiconductor layer 28 comprises pure silicon, with no germanium added therein. Semiconductor layer 28 may also comprise substantially pure silicon with a small percent of germanium added therein, and the germanium percentage is smaller than about 5 percent, for example. Semiconductor layer 28 has thickness T2, which is smaller than about 150 nm, and may be in the range between about 30 nm and about 150 nm.

Figure 2:
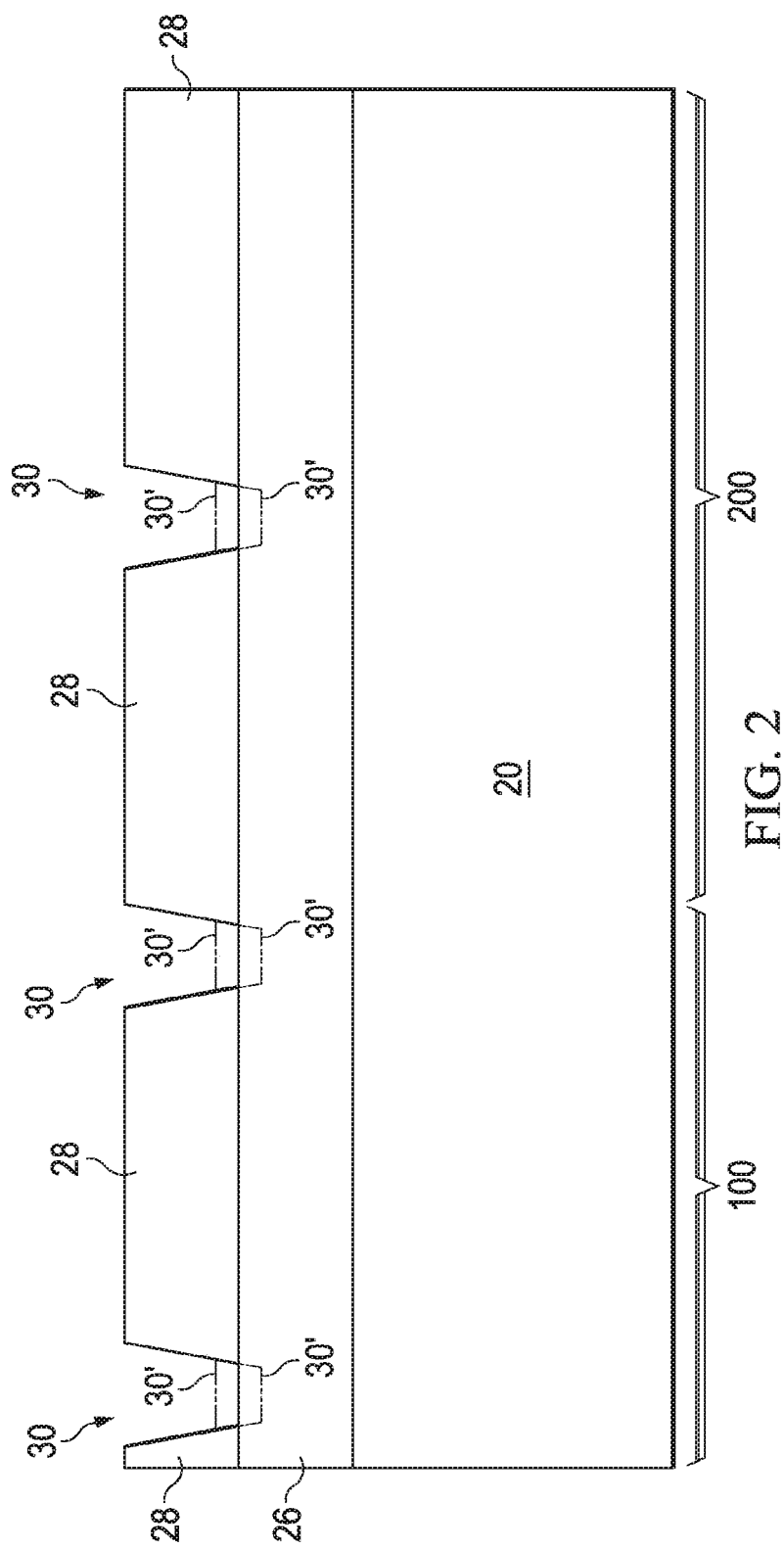

FIG. 2 illustrates the formation of trenches 30 in semiconductor layer 28, which is performed by forming and patterning a photo resist (not shown) over semiconductor layer 28, and then etching semiconductor layer 28. In some embodiments, as shown in FIG. 2, the bottoms of trenches 30 are substantially level with the top surface of semiconductor layer 26, and hence some portions of semiconductor layer 26 are exposed through trenches 30. In alternative embodiments, the bottoms of trenches 30 are higher than or lower than the top surface of semiconductor layer 26. The respective bottoms of trenches 30 are illustrated as dashed lines 30'.

Figure 3:
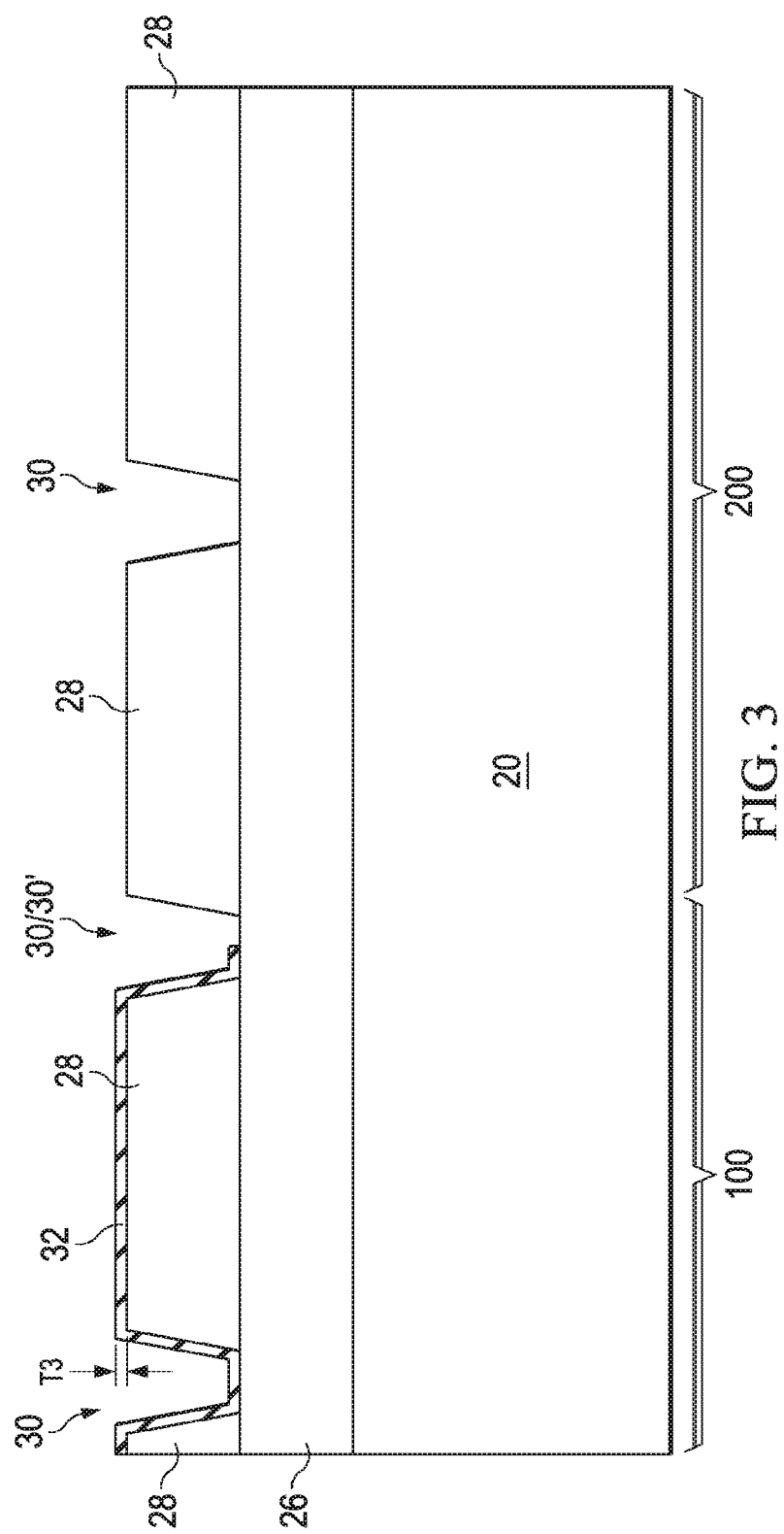

FIG. 3 illustrates the formation of a first mask layer 32, which may be formed of a dielectric material such as a nitride (silicon nitride, for example), silicon oxynitride, silicon carbide, or the like. In some embodiments, mask layer 32 has thickness T3 greater than about 5 nm, and hence in the subsequent oxidation step, mask layer 32 prevents the underlying portions of semiconductor layers 26 and 28 from being oxidized. Mask layer 32 is patterned in an etching step, so that it is removed from NMOS device region 200, and left in PMOS device region 100. Mask layer 32 further extends into some of trenches 30. In some exemplary embodiments, mask layer 32 covers the entire bottom surface and sidewalls of a trench 30 in PMOS device region 100. On the other hand, in one of trenches 30 (marked as 30') at the boundary between device regions 100 and 200, a first portion of mask layer 32 in NMOS device region 200 is removed, while a second portion of mask layer 32 in PMOS device region 100 remains, wherein each of the first portion and the second portion may include a bottom portion and sidewall portions.

Figure 4:
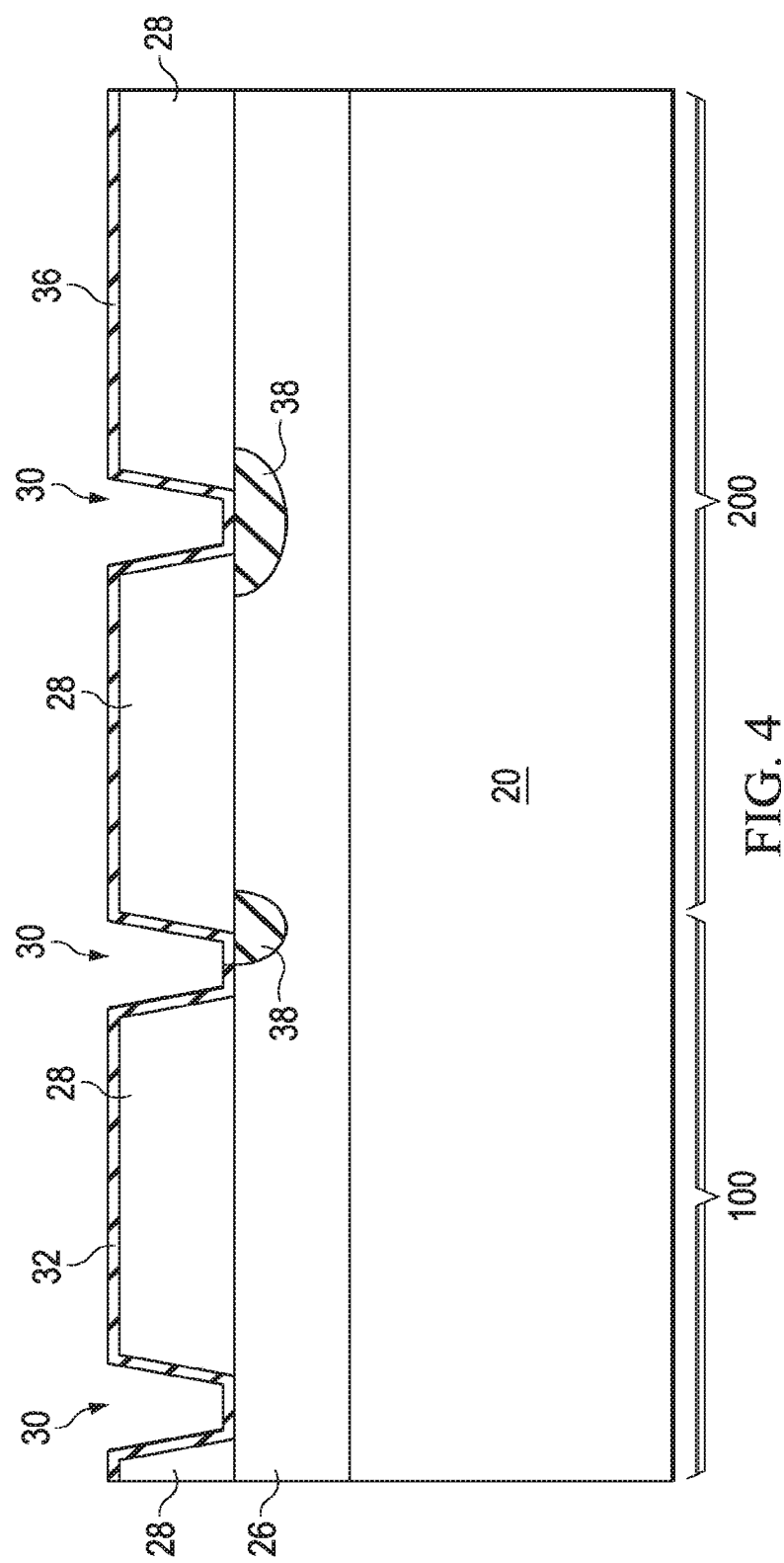

FIGS. 4 and 5 illustrate an oxidation process. As shown in FIG. 4, in the oxidation, oxygen atoms react with the semiconductor materials situated at the exposed portions of semiconductor layers 26 and 28 to form oxide regions 36 and 38. In NMOS device regions 200, oxide regions/layers 36 and 38 are formed, while in PMOS device region 100, mask layer 32 protects the underlying portions of semiconductor layers 26 and 28 from being oxidized. In some embodiments, semiconductor layer 28 includes silicon, and hence the resulting oxide layer 36 is a silicon oxide layer. Semiconductor layer 26 includes silicon germanium in some embodiments, and hence the resulting oxide regions 38 include silicon germanium oxide (SiGeO$_Z$). The expression of the SiGeO$_Z$ herein is non-stoichiometric because various bonding permutations are within the contemplated scope of the present disclosure. The thickness of oxide region 36 and 38 are not illustrated in scale, and oxide layer 36 may be a very thin layer.

In some embodiments, the oxidation process is carried out in a furnace at temperatures from about 400° C. to about 650° C. The oxidation operation is sustained for a period of time between several minutes and several hours. The time duration of the oxidation depends on the desired degree of oxidation in semiconductor layers 26 and 28. In certain embodiments, the furnace is heated up to about 500° C. with oxygen (O$_2$) contained in the furnace.

Silicon germanium (SiGe) has a higher oxidation rate than silicon. In some embodiments, the oxidation rate of the SiGe reaches about 7 to 8 times faster than the oxidation rate of the silicon. Accordingly, referring to FIG. 5, when the oxidation is finished, silicon germanium oxide regions 38 laterally encroach into the region overlapped by un-oxidized portions of semiconductor layer 28. For example, silicon germanium oxide regions 38 may laterally expand beyond the respective edges of trenches 30 by lateral distance L1, which may be greater than about 10 nm.

In the boundary region between PMOS device region 100 and NMOS device region 200, silicon germanium oxide regions 38 may have an unbalance profile, and extends toward PMOS region 100 for a distance much smaller than the distance extending toward NMOS device region 200. For example, in some embodiments, silicon germanium oxide regions 38 may not extend beyond edge 30A of trench 30.

In some embodiments, at the interface between semiconductor layers 26 and 28, silicon oxide regions 36 (marked as 36') are also formed in semiconductor layer 28, and extend laterally along with the encroaching of silicon germanium oxide regions 38. The lateral extension distance L2 of silicon oxide regions 36' may be similar to the lateral extending distance L1. Thickness T4 of silicon oxide regions 36' is much smaller than thickness T5 of silicon germanium oxide regions 38. In some embodiments, ratio T5/T4 is greater than about 5 or even greater. Thicknesses T4 and T5 may be greater than about 1 nm.

Figure 5A:
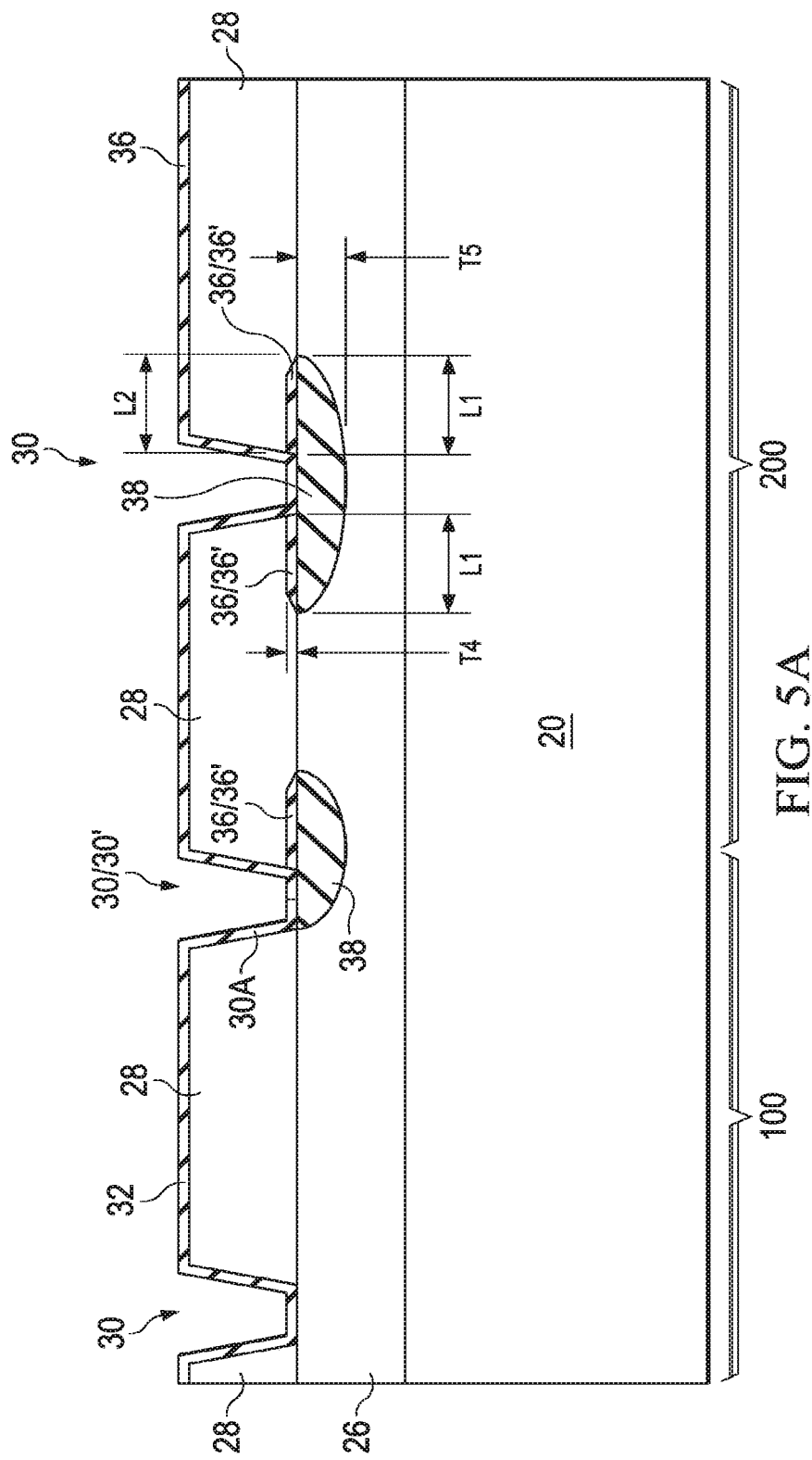
Figure 5B:
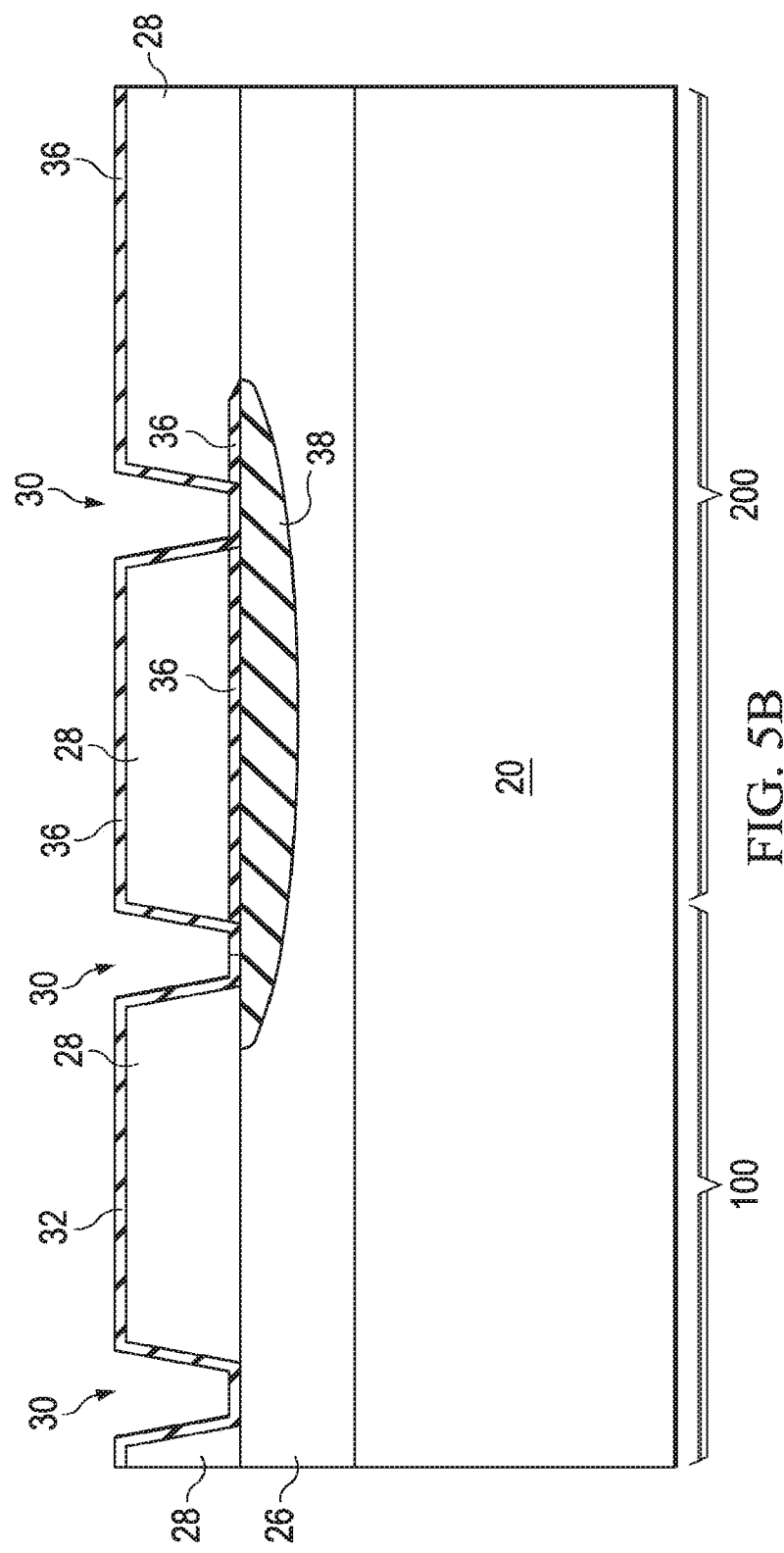

In some embodiments, as shown in FIG. 5A, the oxidation is finished when the silicon germanium oxide regions 38 grown under neighboring trenches 30 are still separated from each other. Accordingly, at least a portion of the channel region of the resulting NMOS device 202 (FIGS. 11A and 11B) does not overlap any silicon germanium oxide regions 38. Further in these embodiments, the sidewalls of silicon germanium oxide regions 38 are not vertical and are not straight. In alternative embodiments, as shown in FIG. 5B, when the oxidation is finished, the silicon germanium oxide regions 38 grown under neighboring trenches 30 are joined. This is achieved by extending the oxidation time. In these embodiments, the portion of semiconductor layer 28 between neighboring trenches 30 is situated over a continuous silicon germanium oxide region 38. Since semiconductor layer 28 is used to form an NMOS device (refer to NMOS device 202 in FIGS. 11A and 11B), the source/drain region of the NMOS device is fully isolated from substrate 20, and hence the leakage current is substantially eliminated.

Figure 6:
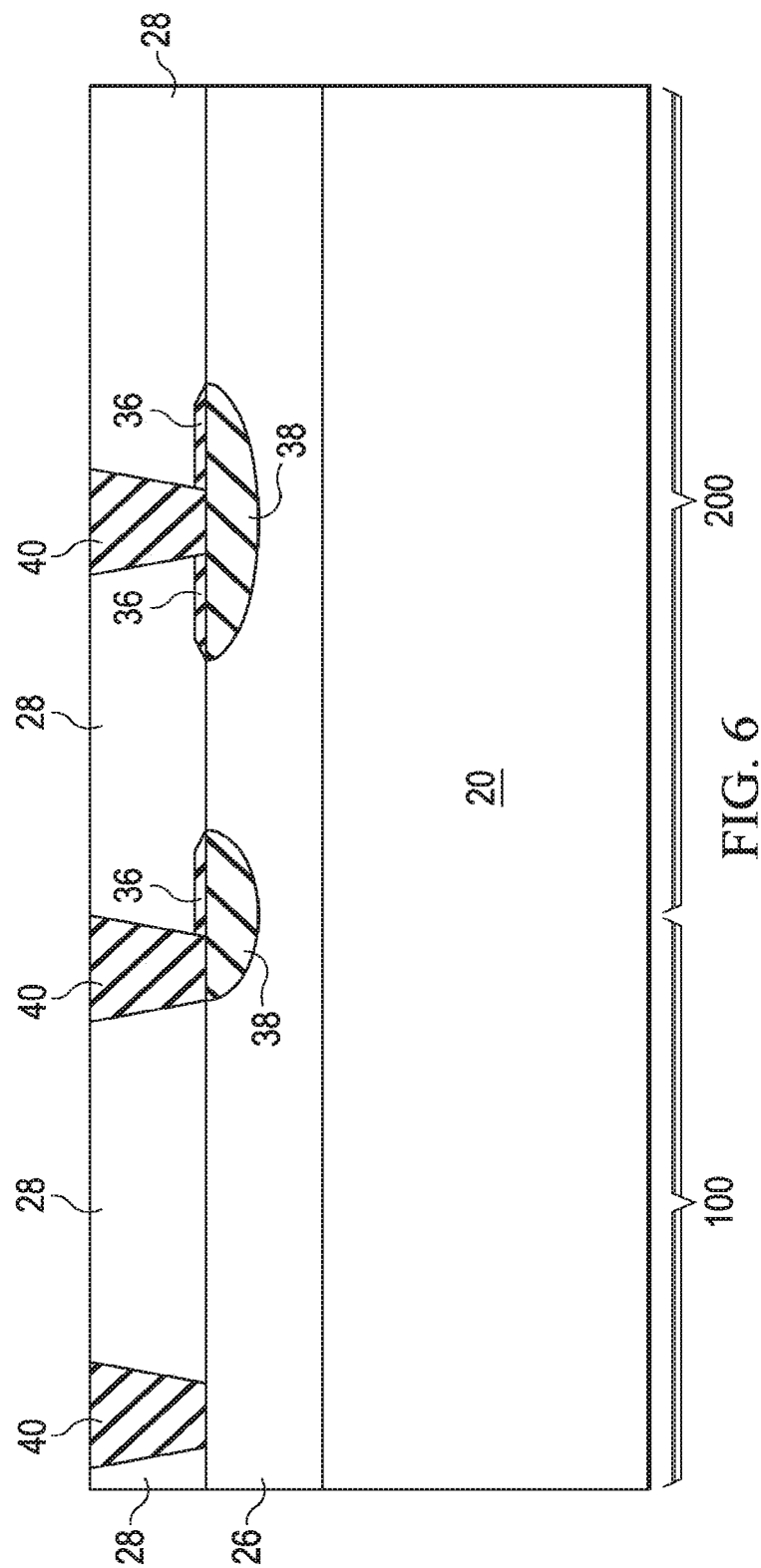

Referring to FIG. 6, insulation regions such as Shallow Trench Isolation (STI) regions 40 are formed to fill trenches 30 in FIG. 5A or 5B. STI regions 40 may be formed by filling trenches 30 with a dielectric material such as silicon oxide, followed by a Chemical Mechanical Polish (CMP) to remove excess portions of the dielectric material. The remaining portions of the dielectric material form STI regions 40. Furthermore, mask layer 32 (FIG. 5A or 5B) may also have portions remaining to form portions of the STI regions 40 in the PMOS device region 100.

Figure 7:
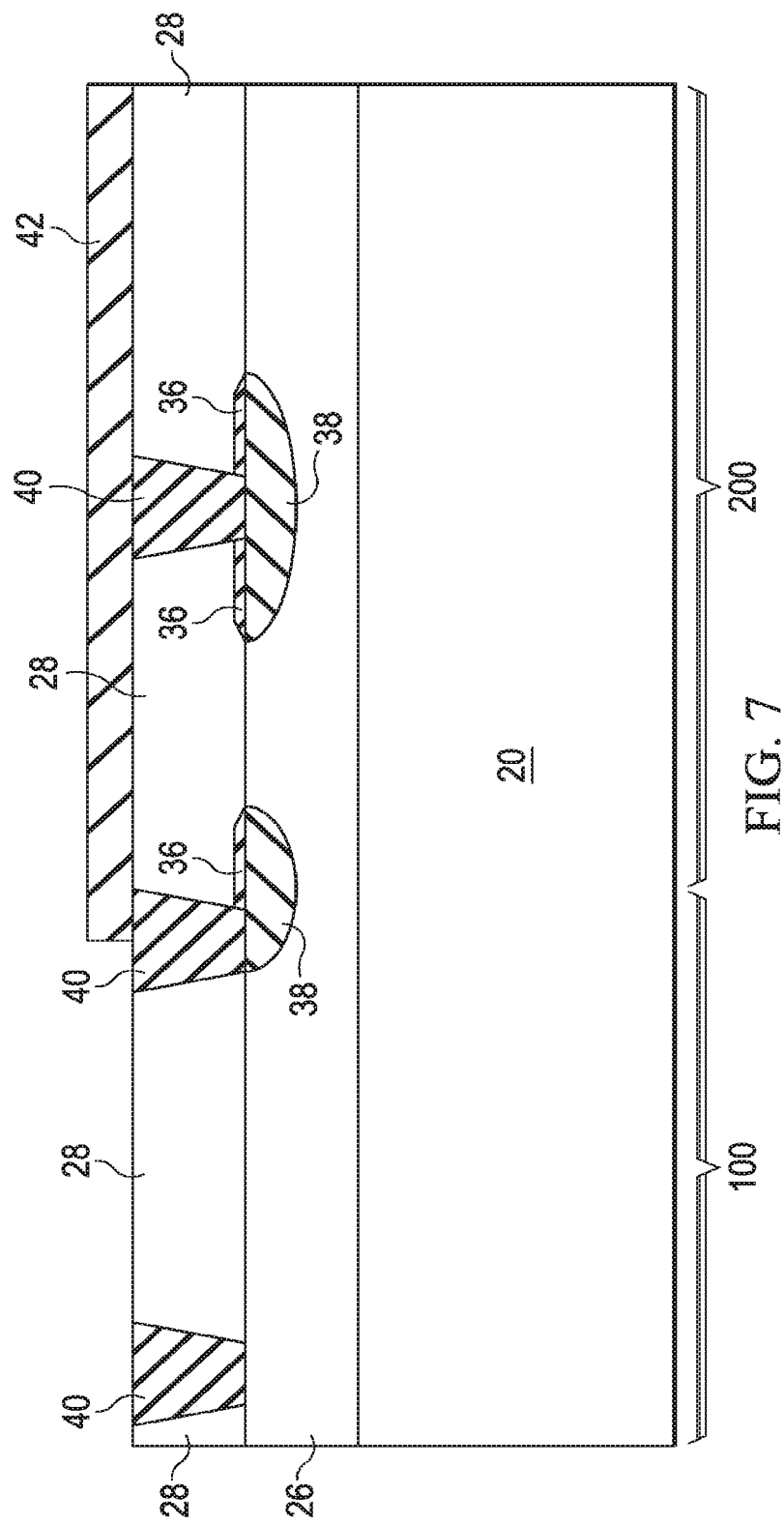

FIG. 7 illustrates the formation of a second mask layer 42. In some embodiments, mask layer 42 comprises a nitride such as silicon nitride, an oxide such as silicon oxide, an oxynitride such as silicon oxynitride, or the like. Mask layer 42 is patterned, so that it is left in NMOS device region 200, and is removed from PMOS device region 100.

Figure 8A:
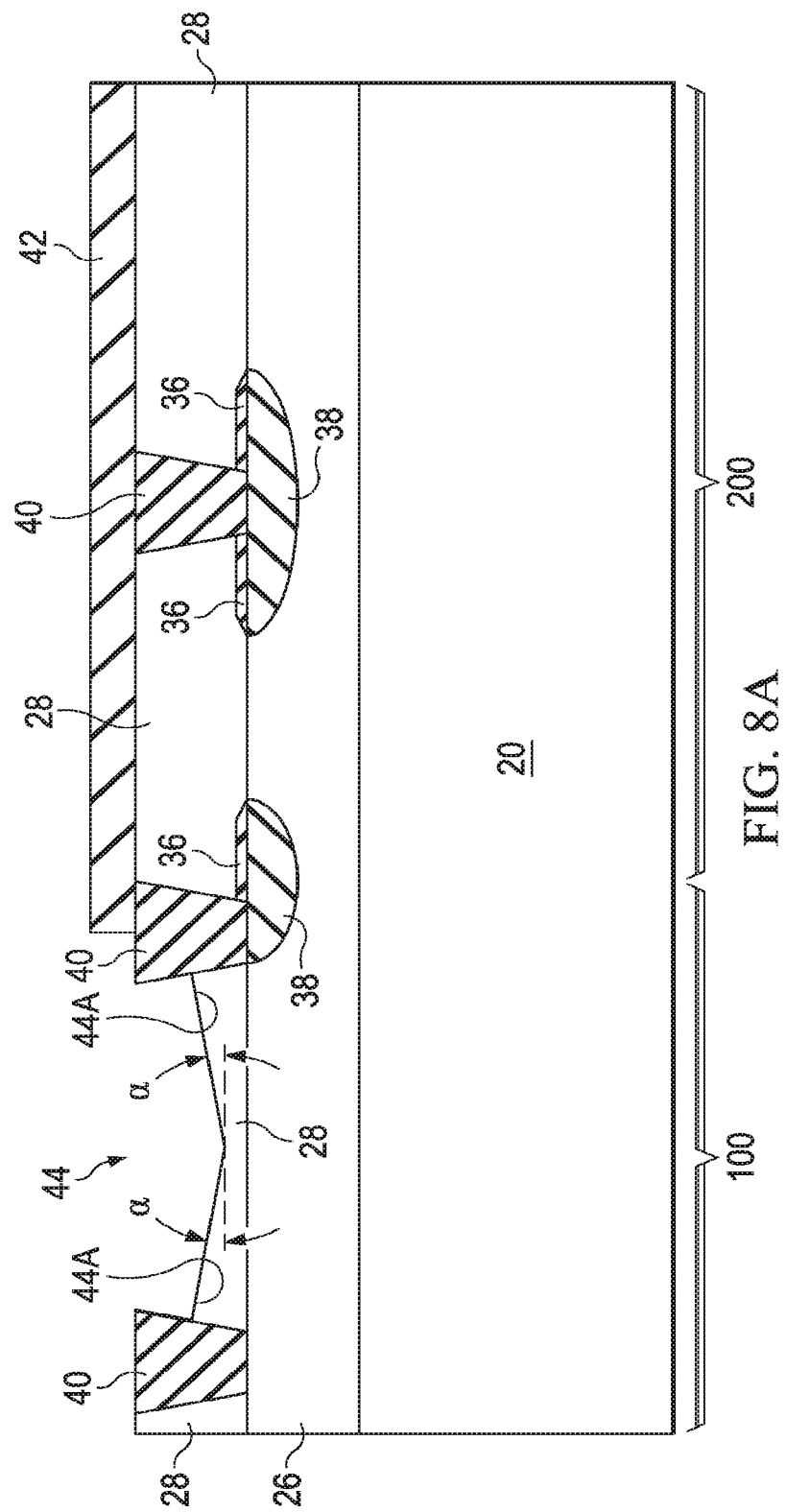
Figure 8B:
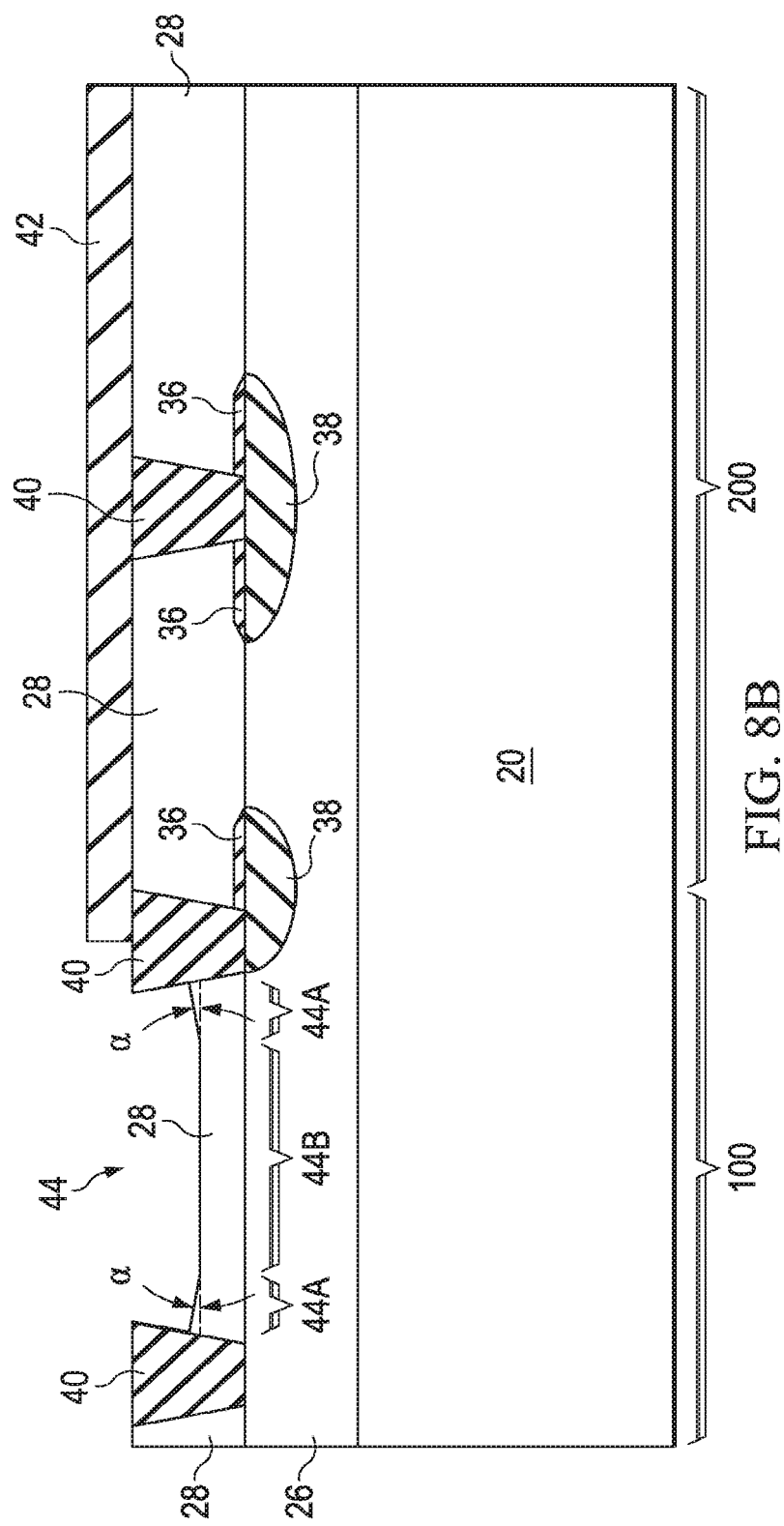

FIGS. 8A and 8B illustrate the etching of semiconductor layer 28 in PMOS device region 100 in accordance with different embodiments, wherein mask layer 42 is used as an etching mask. The etching may be performed using wet etching or dry etching. In some exemplary embodiments in which wet etching is used, the etching solution includes Methyl Ammonium Hydroxide (TMAH), Potassium Hydroxide (KOH), or the like. The process conditions such as the etching solution concentration, the temperature, and the like are adjusted, so that the bottom surfaces 44A include a (551) surface plane(s) of semiconductor layer 28. In alternative embodiments in which dry etching is used, Cl$_2$ or NF$_3$ may be used as the etchant gas.

As a result of the etching process, slant bottom surfaces 44A are formed as parts of the bottom surfaces of trenches 44. In some embodiments, slant bottom surfaces 44A are (551) surfaces on (551) surface planes of the silicon crystal of semiconductor layer 28. In the embodiments shown in FIG. 8A, the entire bottom surfaces of trenches 44 are (551) surfaces, which form a V-shape in the cross-sectional view. The V-shaped bottom surface includes two slanted (551) surface planes joining to each other. Tilt angles a of slant bottom surfaces 44A, which tilt angles are relative to the major top and bottom surfaces of substrate 20 and semiconductor layers 26 and 28, are about 8 degrees.

In the embodiments shown in FIG. 8B, in additional to the slanted (551) surfaces 44A, bottom surface 44 further includes flat surface 44B, with slanted surfaces 44A connected to the opposite ends of flat surface 44B. In some embodiments, substrate 20 has a (001) top surface plane, and hence flat surface 44B also has a (001) surface plane. Tilt angle a of slant bottom surfaces 44A, which tilt angle is also formed between bottom surfaces 44A and 44B, is thus about 8 degrees. Tilt angle a is also the angle of slant bottom surfaces 44A with relative to the major top and bottom surfaces of semiconductor layers 26 and 28 and substrate 20.

In the etching steps, process conditions are adjusted, so that the (551) bottom surfaces 44A are significant parts of all bottom surfaces of trench 44. For example, the total area of (551) bottom surfaces may be more than about 50 percent of the total area of all bottom surfaces of trench 44. To increase the area of (551) bottom surfaces 44A, some process conditions in the etching are adjusted. For example, the adjusted process conditions include adjusting the etchant concentration, for example, adjusting concentration of the OH-containing etchant (in water) in the range between about 2 percent and about 10 percent. The various factors that may lead to the generation and the enlargement of the (551) plans include the type of chemicals in the etching solution, the concentration of the chemicals in the etching solution, and the temperature, etc. These factors in combination affect the area of (551) bottom surfaces 44A, and the change of one factor may need the adjustment of other factors in order to generate a large area of (551) bottom surfaces 44A.

As shown in FIGS. 8A and 8B, when the etching of semiconductor layer 28 is finished, semiconductor layer 28 still has a bottom layer un-etched and left at the bottom of trench 44, which portion has a thickness greater than about 5 nm, for example. Accordingly, semiconductor layer 26 is not exposed through trench 44.

Figure 9:
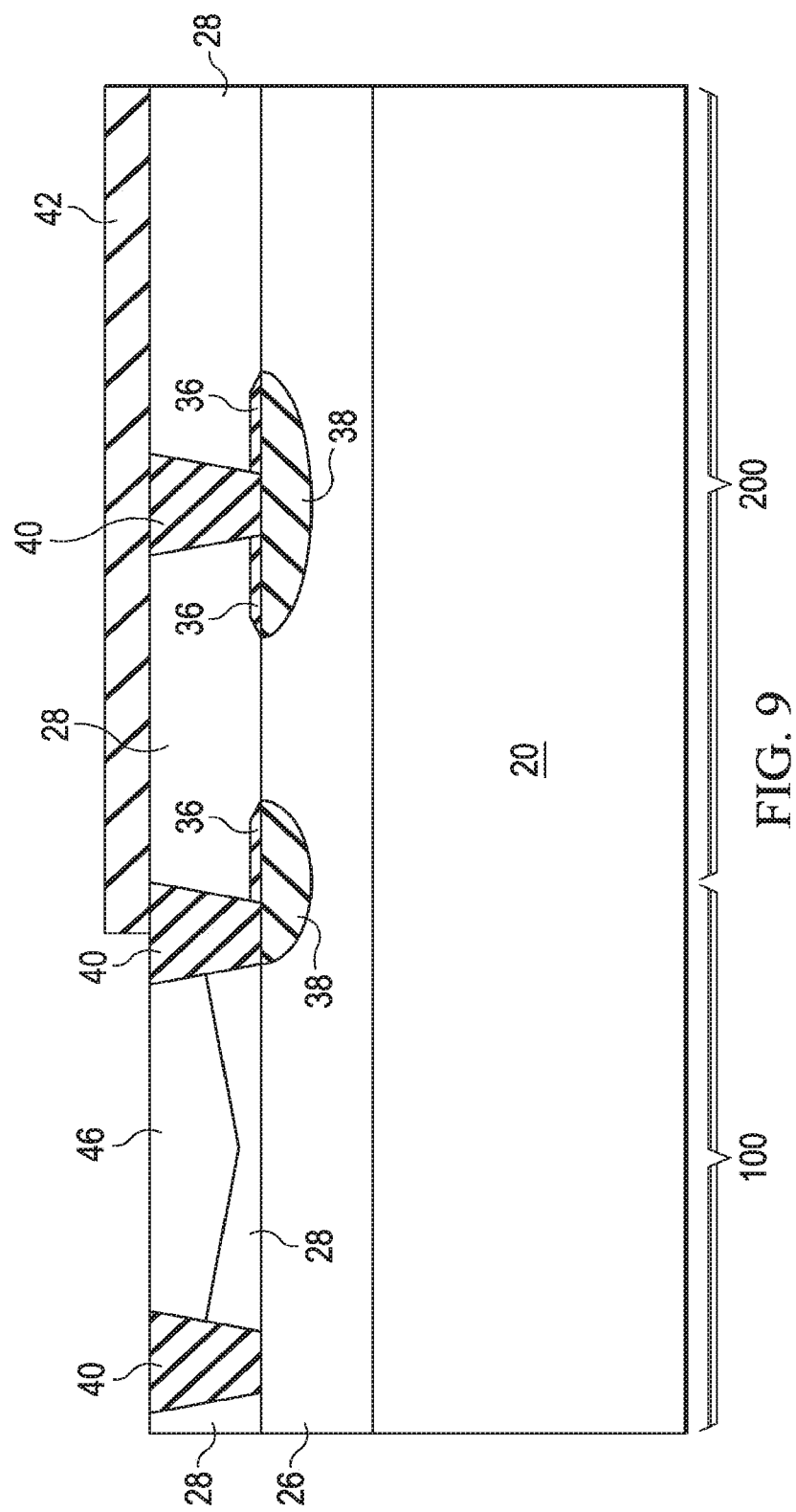

Next, as shown in FIG. 9, epitaxy semiconductor region 46 is grown in trench 44 through selective epitaxy, wherein semiconductor region 46 is grown from the top surface of the remaining semiconductor layer 28, but not from the exposed dielectric regions. In some embodiments, semiconductor region 46 comprises silicon germanium, which is expressed as $Si_{1-Y}Ge_Y$, wherein value Y is the atomic percentage of germanium in semiconductor region 46. Value Y may be higher than about 0.4 (40 percent), and may be in the range between about 0.4 and about 1.0. Value Y may also be equal to 1.0, which means that semiconductor region 46 is a germanium layer free from silicon. Furthermore, value Y is greater than value X of semiconductor layer 26 (which is expressed as $Si_{1-X}Ge_X$), with the difference (Y–X) being greater than about 0.1, greater than about 0.3, or greater than about 0.5, for example. A greater difference (Y–X) may advantageously result in a greater compressive strain in semiconductor region 46.

Figure 10:
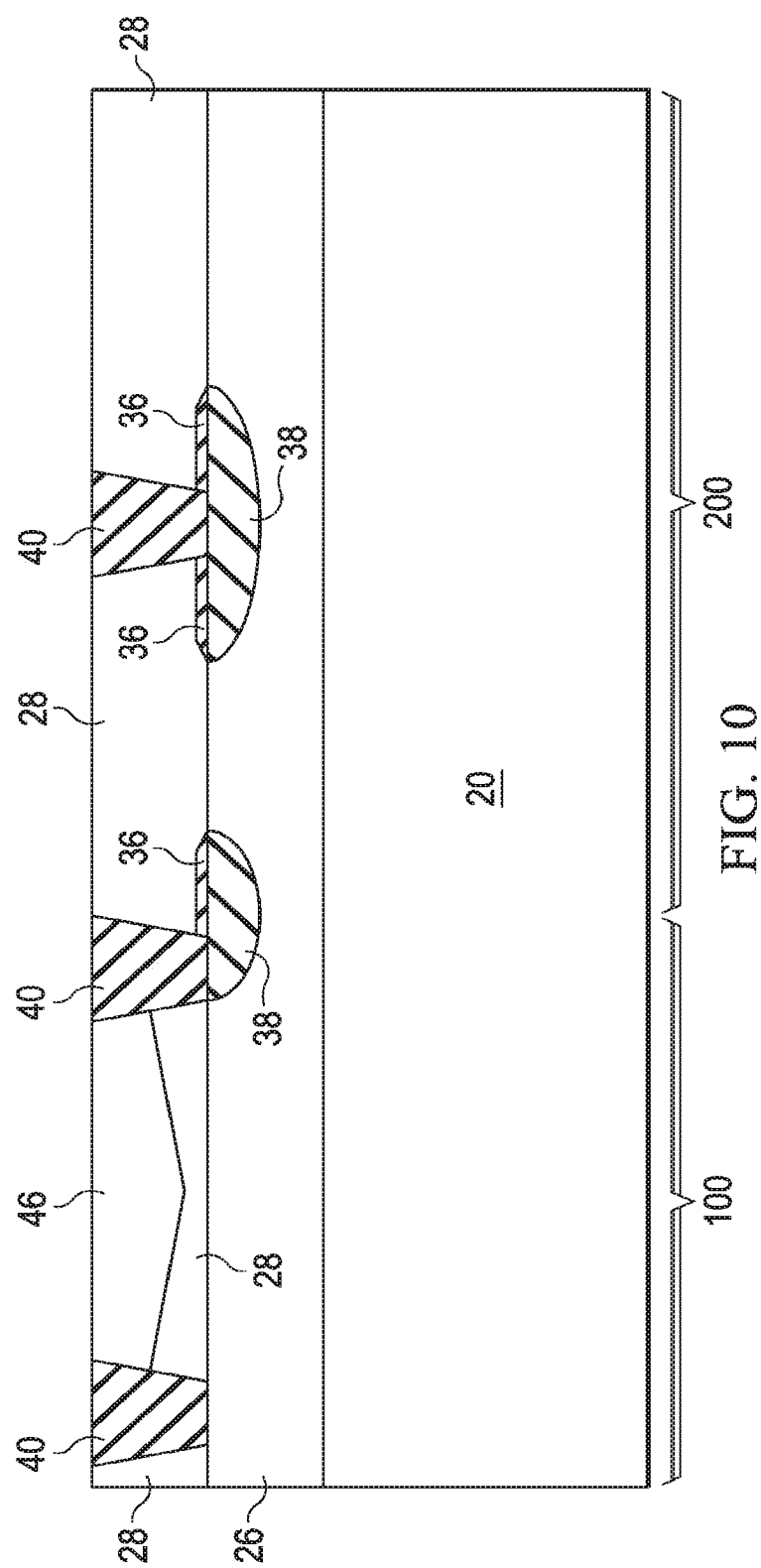

Next, as shown in FIG. 10, mask layer 42 in FIG. 9 is removed. The top surface of the structure in FIG. 10 is also planarized, for example, in a CMP step.

Figure 11A:
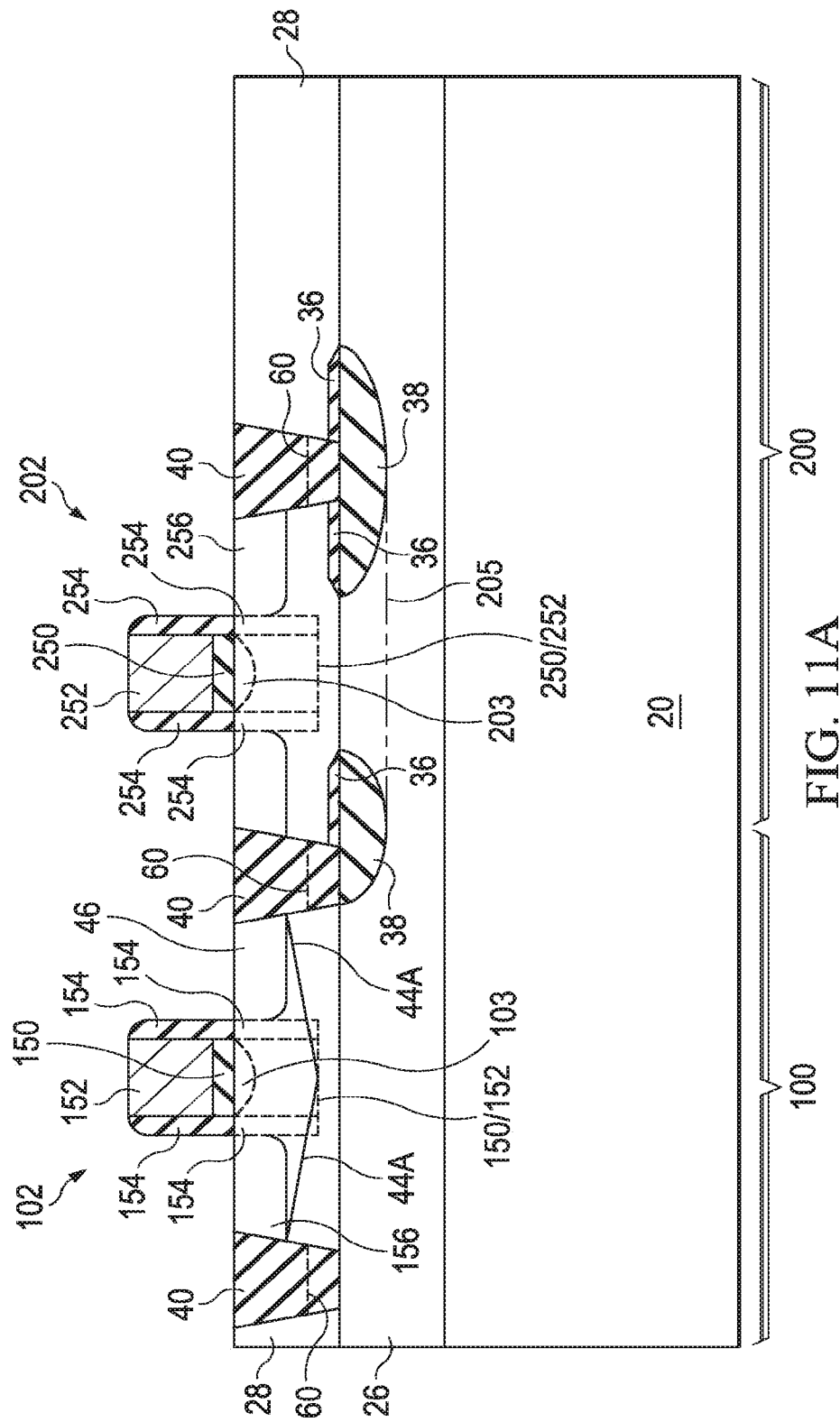
Figure 11B:
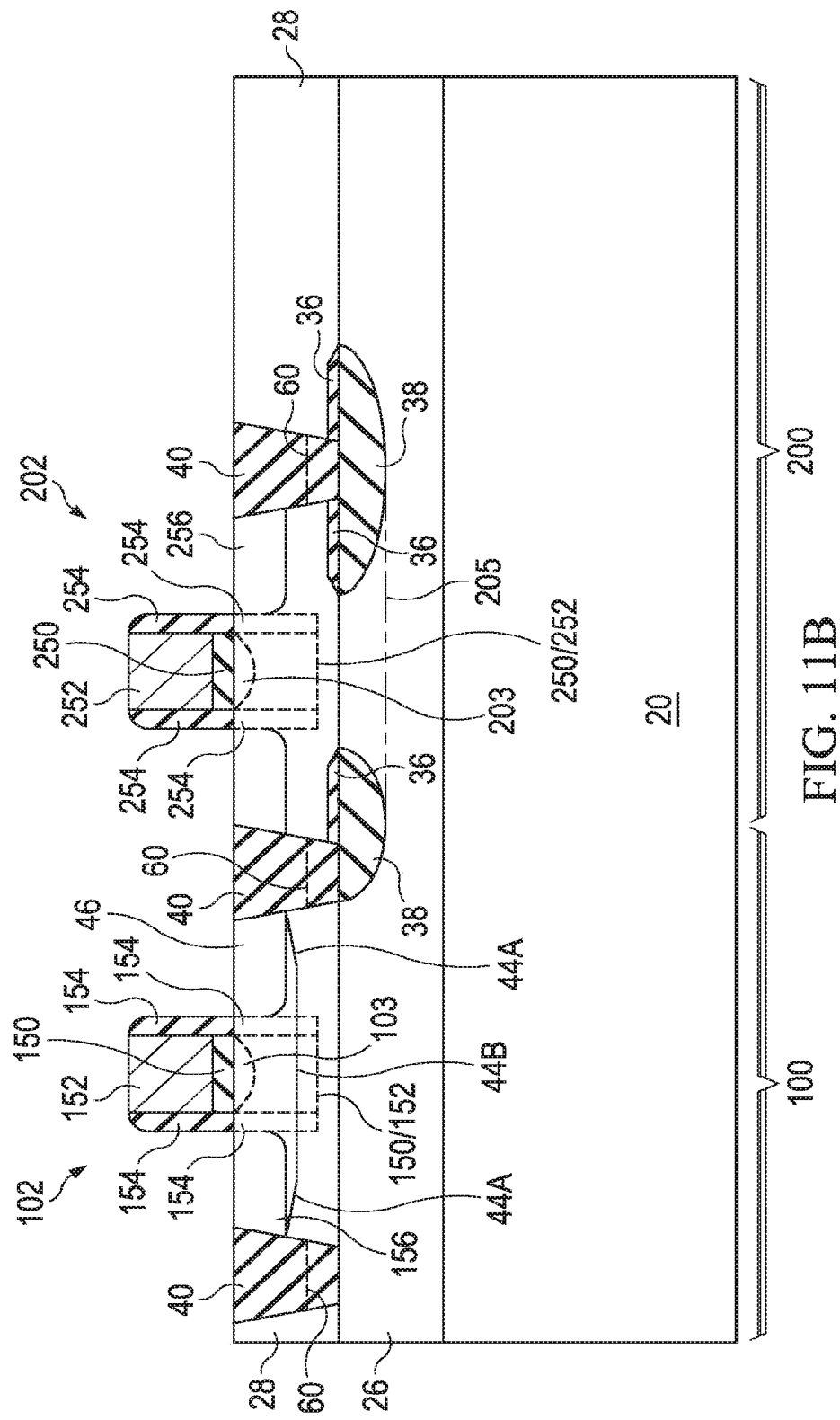
FIG. 11B illustrates a cross-sectional view of a CMOS device in accordance with some embodiments.

FIGS. 11A and 11B illustrate the formation of PMOS device 102 and NMOS device 202, which adopt portions of semiconductor region 46 and semiconductor layer 28, respectively, as channel regions 103 and 203, respectively. PMOS device 102 and NMOS device 202 are in combination referred to as a CMOS device. The formation of PMOS device 102 and NMOS device 202 includes forming gate dielectrics 150 and 250, gate electrodes 152 and 252, gate spacers 154 and 254, and source and drain regions 156 and 256. In some embodiments, PMOS device 102 and NMOS device 202 are planar devices. Accordingly, gate dielectrics 150 and 250 and gate electrodes 152 and 252 are formed over the planar top surfaces of semiconductor region 46 and semiconductor layer 28, respectively.

In alternative embodiments, PMOS device 102 and NMOS device 202 are Fin Field-Effect Transistors (FinFETs). Accordingly, STI regions 40 are recessed first, for example, to the level marked as 60 (the depth is not up to scaled), so that epitaxy region 46 and semiconductor layer 28 protrude over STI regions 40 to form semiconductor fins. Gate dielectrics 150 and 250 and gate electrodes 152 and 252 are formed on the top surfaces and the sidewalls of the respective semiconductor fins, and hence the resulting FinFETs 102 and 202 are FinFETs.

FIGS. 11A and 11B also illustrate dashed lines 205, which illustrate the bottom surfaces of silicon germanium oxide regions 38 when the silicon germanium oxide regions 38 formed under neighboring trenches 30 are joined to form a continuous oxide region, which embodiment is also shown in FIG. 5B.

The embodiments of the present disclosure have some advantageous features. By forming silicon germanium oxide regions that laterally extend underlying the source/drain regions (and possibly the channel) of NMOS devices, the leakage from the source/drain region to the substrate is hampered by the lateral encroaching silicon germanium oxide regions. The silicon germanium oxide regions do not extend under the source/drain regions and the channels for PMOS devices, so that the compressive stress of the PMOS devices are not adversely affected by the silicon germanium oxide regions. PMOS devices are formed on the epitaxy semiconductor regions, which are grown from (551) surfaces. This advantageously results in the reduction in the defect of the epitaxy semiconductor regions. (551) surfaces are suitable for epitaxy, and the semiconductors grown from (551) surfaces have a smaller surface roughness, and hence improved quality.

In accordance with some embodiments, a device includes a first semiconductor layer, and a second semiconductor layer over the first semiconductor layer. The first semiconductor layer and the second semiconductor layer comprise different materials. A semiconductor region is overlying and contacting the second semiconductor layer, wherein a bottom surface of the semiconductor region contacts a first top surface of the second semiconductor layer. The semiconductor region and the second semiconductor layer comprise different material. The bottom surface of the semiconductor region has a slanted portion contacting a (551) surface plane of the second semiconductor layer.

In accordance with other embodiments, a device includes a silicon substrate, a silicon germanium layer having a first germanium percentage, a silicon layer over the silicon germanium layer, and a silicon germanium region having a bottom surface over and contacting a first top surface of the silicon layer. The silicon germanium region has a second germanium percentage higher than the first germanium percentage. A PMOS device includes a first gate dielectric over the silicon germanium region. An NMOS device includes a second gate dielectric over a second top surface of the silicon layer, and a source/drain region adjacent to the second gate dielectric. An STI region is in the silicon layer, wherein the first STI region contacts the source/drain region. A silicon germanium oxide region is in the silicon germanium layer. The silicon germanium oxide region includes a first portion underlying and contacting the first STI region, and a second portion overlapped by the source/drain region of the NMOS device.

In accordance with yet other embodiments, a method includes performing a first epitaxy to form a silicon germanium layer over a substrate, wherein the silicon germanium layer has a first germanium percentage, and performing a second epitaxy to form a silicon layer over the silicon germanium layer. The silicon layer is etched to form a trench, with a bottom portion of silicon layer left under the trench. The bottom portion of the silicon layer has a top surface including a slanted portion, with the slanted portion including a (551) plane of the silicon layer. A third epitaxy is performed to form a silicon germanium region in the trench. The silicon germanium region has a bottom surface over and contacting the top surface of the silicon layer. The method further includes forming a PMOS device, which formation includes forming a gate dielectric over a top surface of the silicon germanium region, with a channel region of the PMOS device in the silicon germanium region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    performing a first epitaxy to form a silicon germanium layer over a substrate, wherein the silicon germanium layer has a first germanium percentage;
    performing a second epitaxy to form a silicon layer over the silicon germanium layer;
    etching the silicon layer to form a trench, with a bottom portion of the silicon layer left under the trench, wherein the bottom portion of the silicon layer has a top surface comprising a first slanted portion, with the first slanted portion has a (551) surface plane;
    performing a third epitaxy to form a silicon germanium region in the trench, wherein the silicon germanium region has a bottom surface over and contacting the (551) surface plane; and
    forming a P-type Metal-Oxide-Semiconductor (PMOS) device comprising:
        forming a first gate dielectric over a top surface of the silicon germanium region, with a channel region of the PMOS device in the silicon germanium region.

2. The method of claim 1, wherein the top surface of the bottom portion of the silicon layer further comprises a second slanted portion at an additional (551) surface plane of the silicon layer.

3. The method of claim 2, wherein the first slanted portion joins the second slanted portion to form a V-Shape.

4. The method of claim 2, wherein the first slanted portion and the second slanted portion are connected to opposite ends of a flat portion of the top surface of the silicon layer, and wherein the flat portion is parallel to a major top surface of the substrate.

5. The method of claim 1 further comprising:
    forming a first additional trench and a second additional trench in the silicon layer;
    performing an oxidation on the silicon germanium layer through the second additional trench to form a silicon germanium oxide region in the silicon germanium layer;
    filling the first additional trench and the second additional trench to form a first Shallow Trench Isolation (STI) region and a second STI region, respectively; and
    forming an N-type Metal-Oxide-Semiconductor (NMOS) device comprising:
        forming a second gate dielectric over the silicon layer, with a portion of the silicon layer being a channel region of the NMOS device; and
        forming a source/drain region adjacent to the second gate dielectric, wherein a portion of the source/drain region overlaps a portion of the silicon germanium oxide region.

6. The method of claim 5 further comprising forming a mask layer to cover a bottom and sidewalls of the trench, wherein bottoms and sidewalls of the first additional trench and the second additional trench are not covered by the mask layer.

7. The method of claim 5, wherein the channel region of the NMOS device overlaps the silicon germanium oxide region.

8. A method comprising:
    performing a first epitaxy to form a silicon germanium layer over a substrate, wherein the silicon germanium layer has a first germanium percentage;
    performing a second epitaxy to form a silicon layer over the silicon germanium layer;
    etching the silicon layer to form a first trench in a P-type Metal-Oxide-Semiconductor (PMOS) region, and a second trench in an N-type Metal-Oxide-Semiconductor (NMOS) region;
    performing an oxidation on the silicon germanium layer through the second trench to form a first silicon germanium oxide region in the silicon germanium layer, wherein during the oxidation, the first trench is covered from the oxidation by a mask layer;
    forming a PMOS device in the PMOS region; and
    forming an NMOS device in the NMOS region.

9. The method of claim 8, wherein the etching the silicon layer further generates a third trench in the silicon layer, wherein the silicon germanium layer is oxidized through the third trench to form a second silicon germanium oxide region.

10. The method of claim 9, wherein the first silicon germanium oxide region is merged with the second silicon germanium oxide region, and a portion of the silicon layer remains to overlap a combined region comprising the first silicon germanium oxide region and the second silicon germanium oxide region.

11. The method of claim 9, wherein when the NMOS is formed, the first silicon germanium oxide region is spaced apart from the second silicon germanium oxide region, and the first silicon germanium oxide region and the second silicon germanium oxide region are overlapped by a first source/drain region and a second source/drain region, respectively, of the NMOS device.

12. The method of claim 8 further comprising filling the first trench and the second trench to form a first Shallow Trench Isolation (STI) region and a second STI region, respectively, wherein the second STI region contacts the first silicon germanium oxide region.

13. The method of claim 12, wherein the mask layer extends into the first trench, and the method further comprises removing the mask layer before the first STI region is formed.

14. The method of claim 8, wherein the forming the NMOS device comprises:
   forming a gate dielectric over the silicon layer, with a portion of the silicon layer being a channel region of the NMOS device; and
   forming a source/drain region adjacent to the gate dielectric, wherein a portion of the source/drain region overlaps a portion of the first silicon germanium oxide region.

15. The method of claim 8, wherein the etching the silicon layer stops on the silicon germanium layer.

16. The method of claim 8 further comprising, before the forming the PMOS device, etching a top portion of the silicon layer in the PMOS region to form a trench, with a bottom portion of silicon layer left under the trench, wherein the bottom portion of the silicon layer has a top surface in a (551) surface plane of the silicon layer.

17. A method comprising:
   etching a silicon layer to form a first trench, a second trench, and a third trench, with a silicon germanium layer underlying the silicon layer being exposed through the first trench, the second trench, and the third trench;
   covering the first trench with a mask layer, wherein the second trench and the third trench are at least partially exposed through the mask layer;
   performing an oxidation to form a first silicon germanium oxide region and a second silicon germanium oxide region, with the first silicon germanium oxide region and the second silicon germanium oxide region exposed to the second trench and the third trench, respectively; and
   forming an N-type Metal-Oxide-Semiconductor (NMOS) device, wherein the first silicon germanium oxide region and the second silicon germanium oxide region are overlapped by a first source/drain region and a second source/drain region of the NMOS device, respectively.

18. The method of claim 17, wherein the second trench is covered partially by the mask layer.

19. The method of claim 17 further comprising:
   removing the mask layer; and
   removing a portion of the silicon layer between the first trench and the second trench to form a recess, with a portion of the silicon layer directly under the recess has a (551) surface plane.

20. The method of claim 19 further comprising growing a silicon germanium region in the recess, wherein the NMOS device is formed on the silicon germanium region.

* * * * *